(12) United States Patent
Tseng et al.

(10) Patent No.: US 12,653,032 B2
(45) Date of Patent: Jun. 9, 2026

(54) ELECTRONIC DEVICE

(71) Applicant: Innolux Corporation, Miaoli County (TW)

(72) Inventors: Chia-Ping Tseng, Miaoli County (TW); Chia-Chi Ho, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 626 days.

(21) Appl. No.: 18/152,764

(22) Filed: Jan. 11, 2023

(65) Prior Publication Data

US 2023/0246037 A1      Aug. 3, 2023

Related U.S. Application Data

(60) Provisional application No. 63/303,991, filed on Jan. 28, 2022.

(30) Foreign Application Priority Data

Nov. 9, 2022    (CN) .......................... 202211399436.3

(51) Int. Cl.
*H10W 42/20*      (2026.01)
*H10D 30/67*      (2025.01)
*H10W 40/25*      (2026.01)
*H10W 42/60*      (2026.01)

(52) U.S. Cl.
CPC ........ *H10W 42/20* (2026.01); *H10D 30/6704* (2025.01); *H10D 30/6723* (2025.01); *H10W 40/255* (2026.01); *H10W 40/258* (2026.01); *H10W 42/60* (2026.01)

(58) Field of Classification Search
CPC ............... H01L 23/552; H01L 23/3735; H01L 23/3736; H01L 23/60; H01L 25/167; H10D 30/6704; H10D 30/6723; H10K 59/126; H10W 42/20; H10W 40/255; H10W 40/258; H10W 42/60

See application file for complete search history.

(56) References Cited

U.S. PATENT DOCUMENTS

| | | | | |
|---|---|---|---|---|
| 5,771,082 A | * | 6/1998 | Chaudet ............ | G02F 1/136213 349/39 |
| 10,644,043 B2 | | 5/2020 | Liu et al. | |
| 11,069,292 B1 | * | 7/2021 | Heganovic ............. | G09G 3/325 |
| 2003/0230748 A1 | * | 12/2003 | Shih ................... | H10D 30/6723 257/59 |

(Continued)

FOREIGN PATENT DOCUMENTS

| | | |
|---|---|---|
| CN | 108666325 | 10/2018 |
| CN | 114551441 | 5/2022 |

OTHER PUBLICATIONS

"Search Report of Europe Counterpart Application", issued on Jun. 22, 2023, p. 1-p. 7.

*Primary Examiner* — Peter M Albrecht
(74) *Attorney, Agent, or Firm* — JCIPRNET

(57)      ABSTRACT

An electronic device including a substrate, a conductive layer, a first driving component, and an electronic component is provided. The conductive layer is disposed on the substrate. A thickness of the conductive layer is between 0.5 μm and 12 μm. The first driving component is disposed on the conductive layer. The electronic component is disposed on the substrate and electrically connected to the first driving component.

16 Claims, 7 Drawing Sheets

10a

(56)     References Cited

U.S. PATENT DOCUMENTS

| | | | |
|---|---|---|---|
| 2004/0119075 A1* | 6/2004 | Murade ............. | H10D 30/6723 |
| | | | 257/72 |
| 2007/0210303 A1* | 9/2007 | Ikeda ................ | H10D 30/6723 |
| | | | 257/40 |
| 2010/0301338 A1* | 12/2010 | Abe ...................... | H01L 23/552 |
| | | | 257/57 |
| 2016/0254338 A1* | 9/2016 | Lin ...................... | H10K 59/126 |
| | | | 257/40 |
| 2017/0170329 A1* | 6/2017 | Su ......................... | H01L 23/552 |
| 2018/0203169 A1* | 7/2018 | Watabe ............. | H10D 30/6723 |
| 2022/0140149 A1* | 5/2022 | Luo ................... | H10D 30/6723 |
| | | | 257/288 |

* cited by examiner

ELECTRONIC DEVICE

CROSS-REFERENCE TO RELATED APPLICATION

This application claims the priority benefit of U.S. provisional application Ser. No. 63/303,991, filed on Jan. 28, 2022 and China application serial no. 202211399436.3, filed on Nov. 9, 2022. The entirety of each of the above-mentioned patent applications is hereby incorporated by reference herein and made a part of this specification.

BACKGROUND

Technical Field

The disclosure relates to an electronic device, and more particularly, to an electronic device including a tunable element.

Description of Related Art

In order to enable an electronic component in an electronic device to achieve various functions such as grounding, reducing electromagnetic interference, or quickly dissipating heat, a conductive layer with a large area is generally formed between a substrate and the electronic component in the electronic device. However, when the conductive layer is at a high temperature due to, for example, a process of forming other elements, metal ions (such as copper ions) in the conductive layer may diffuse into a component of the electronic component (such as an active layer of a driving component), which decreases a performance of the electronic device. Furthermore, the electronic device may easily warp due to different thermal expansion coefficients between the substrate and the conductive layer.

SUMMARY

The disclosure provides an electronic device, which is adapted to improve performance of the electronic device and/or reduce warpage of the electronic device.

According to some embodiments of the disclosure, the electronic device includes a substrate, a conductive layer, a first driving and an electronic component. The conductive layer is disposed on the substrate. A thickness of the conductive layer is between 0.5 μm and 12 μm. The first driving component is disposed on the conductive layer. The electronic component is disposed on the substrate and electrically connected to the first driving component.

According to some other embodiments of the disclosure, the electronic device includes a substrate, a conductive layer, an insulating layer, a first driving component and an electronic component. The conductive layer is disposed on the substrate. A thickness of the conductive layer is between 0.5 μm and 12 μm. The insulating layer is disposed on the conductive layer. The first driving component is disposed on the insulating layer. At least a part of the first driving component is not overlapped with the conductive layer. The electronic component is disposed on the substrate and electrically connected to the first driving component.

In order for the aforementioned features and advantages of the disclosure to be more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
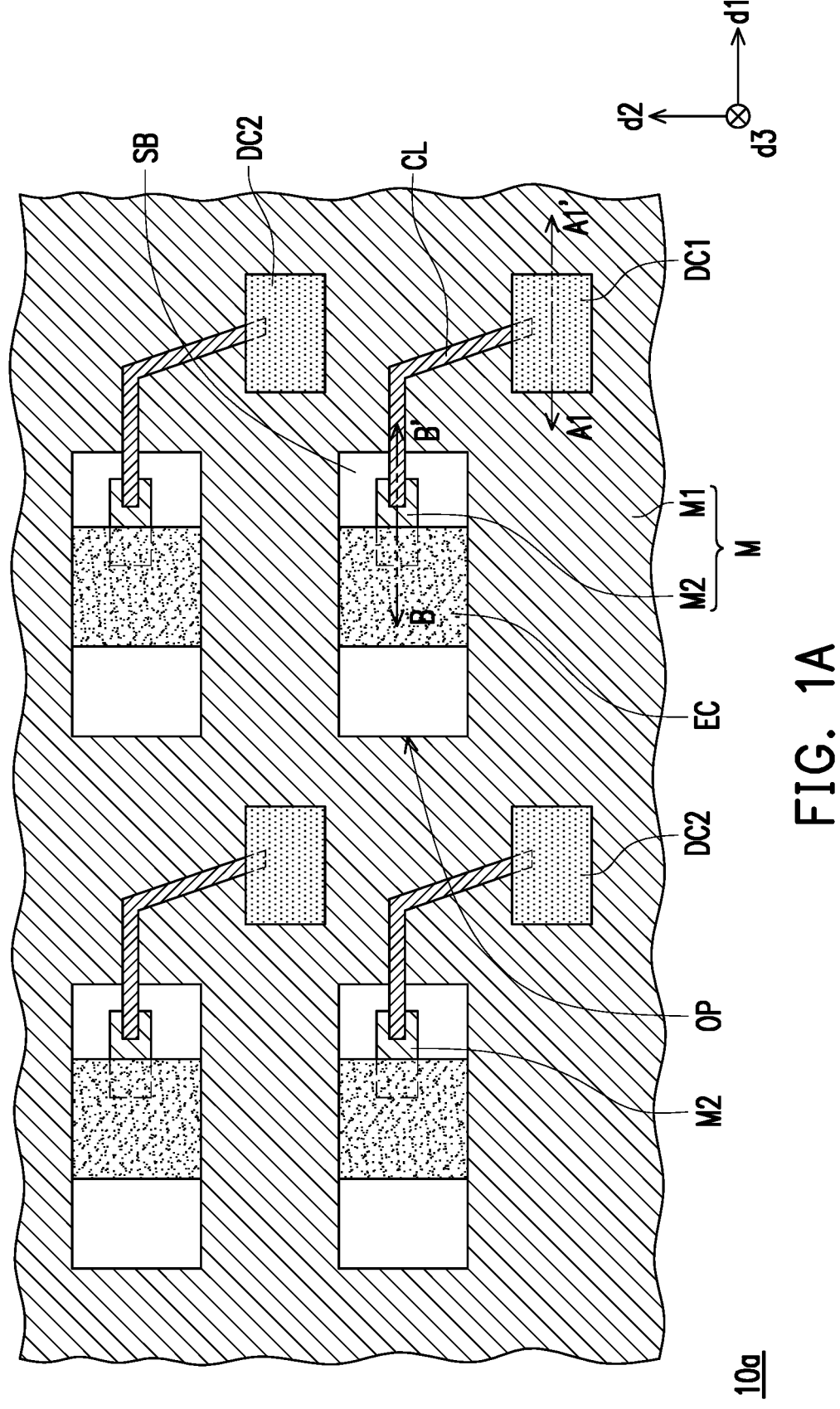
FIG. 1A is a schematic partial top view of an electronic device according to a first embodiment of the disclosure.

The disclosure may be understood by referring to the following detailed description in collaboration with the accompanying drawings. It should be noted that, in order to make the readers easy to understand and for conciseness of the drawings, the multiple drawings in the disclosure only depict a part of the electronic device, and the specific components in the drawings are not drawn according to actual scales. In addition, the number and size of each component in the figures are only for illustration, and are not used to limit the scope of the disclosure.

Certain terms are used throughout the specification of the disclosure and the appended claims to refer to specific components. Those skilled in the art should understand that electronic device manufacturers may probably use different names to refer to the same components. This specification is not intended to distinguish between components that have the same function but different names. In the following specification and claims, the terms "containing", "including", etc., are open terms, so that they should be interpreted as meaning of "including but not limited to . . . ". Therefore, when the terms "including", "containing", and/or "having" are used in the description of the disclosure, they specify existence of corresponding features, regions, steps, operations, and/or components, but do not exclude existence of one or more corresponding features, regions, steps, operations, and/or components.

Directional terminology mentioned in the specification, such as "top", "bottom", "front", "back", "left", "right", etc., is used with reference to the orientation of the figures being described. Therefore, the used directional terminology is only illustrative, and is not intended to be limiting of the disclosure. In the figures, the drawings illustrate general characteristics of methods, structures, and/or materials used in specific embodiments. However, these drawings should not be construed as defining or limiting of a scope or nature covered by these embodiments. For example, for clarity's sake, a relative size, thickness and location of each film layer, area and/or structure may be reduced or enlarged.

When a corresponding component (for example, a film layer or a region) is referred to as being "on" another component, it may be directly on the other component or there may be other components interposed there between.

On the other hand, when a component is referred to as being "directly on" another component, there is no other component there between. In addition, when a component is referred to as "on another component", the two components have an up-down relationship in a plan view direction, and the component may be located above or below the other component, and the up-down relationship depends on an orientation of the device.

The terms "about", "substantially" or "substantially" are generally interpreted as being within 10% of a given value or range, or as being within 5%, 3%, 2%, 1% or 0.5% of a given value or range.

The ordinal numbers used in the specification and claims, such as "first", "second", etc., are used to modify components, and do not imply and represent that the component or these components have any previous ordinal numbers, and do not represent a sequence of one component with another, or a sequence in a manufacturing method. The use of these ordinal numbers is only to make a clear distinction between one component with a certain name and another component with the same name. The same terms may not be used in the claims and the specification, and accordingly, a first component in the specification may be a second component in the claims.

It should be noted that in the following embodiments, features in a plurality of different embodiments may be substituted, reorganized, and mixed to complete other embodiments without departing from the spirit of the present disclosure. The features of the various embodiments may be mixed and matched arbitrarily as long as they do not violate or conflict with the spirit of the disclosure.

The electrical connection or coupling described in this disclosure may refer to direct connection or indirect connection. In the case of direct connection, terminals of components on two circuits are directly connected or connected to each other by a conductor line segment, and in the case of indirect connection, there are switches, diodes, capacitors, inductors, resistors, other suitable components, or a combination of the above components between the terminals of the components on the two circuits, but the disclosure is not limited thereto.

In the disclosure, a thickness, length and width may be measured by using an optical microscope, and the thickness may be obtained by measuring a cross-sectional image in the electron microscope, but the disclosure is not limited thereto. In addition, there may be a certain error in any two values or directions used for comparison. If a first value is equal to a second value, it implies that there may be an error of about 10% between the first value and the second value; if a first direction is perpendicular to a second direction, an angle between the first direction and the second direction may be between 80 degrees and 100 degrees; and if the first direction is parallel to the second direction, the angle between the first direction and the second direction may be between 0 degree and 10 degrees.

The electronic device of the disclosure may include a display device, an antenna device, a sensing device, a light emitting device, or a splicing device, but the disclosure is not limited thereto. The electronic device may include a bendable or flexible electronic device. The electronic device may include electronic components. The electronic device includes, for example, a liquid crystal layer or a light emitting diode (LED). The electronic components may include passive components and active components, such as capacitors, resistors, inductors, variable capacitors, filters, diodes, transistors, sensors, MEMS, liquid crystal chips, etc., but the disclosure is not limited thereto. The diodes may include light emitting diodes or photodiodes. The light emitting diode may include, for example, an organic light emitting diode (OLED), a mini LED, a micro LED, a quantum dot LED, fluorescence, phosphor or other suitable materials, or a combination thereof, but the disclosure is not limited thereto. The sensors may, for example, include capacitive sensors, optical sensors, electromagnetic sensors, fingerprint sensors (FPS), touch sensors, antennas, or pen sensors, etc., but the disclosure is not limited thereto.

Exemplary embodiments of the disclosure are provided below, and the same reference numerals are used in the drawings and descriptions to denote the same or similar parts.

Figure 1B:
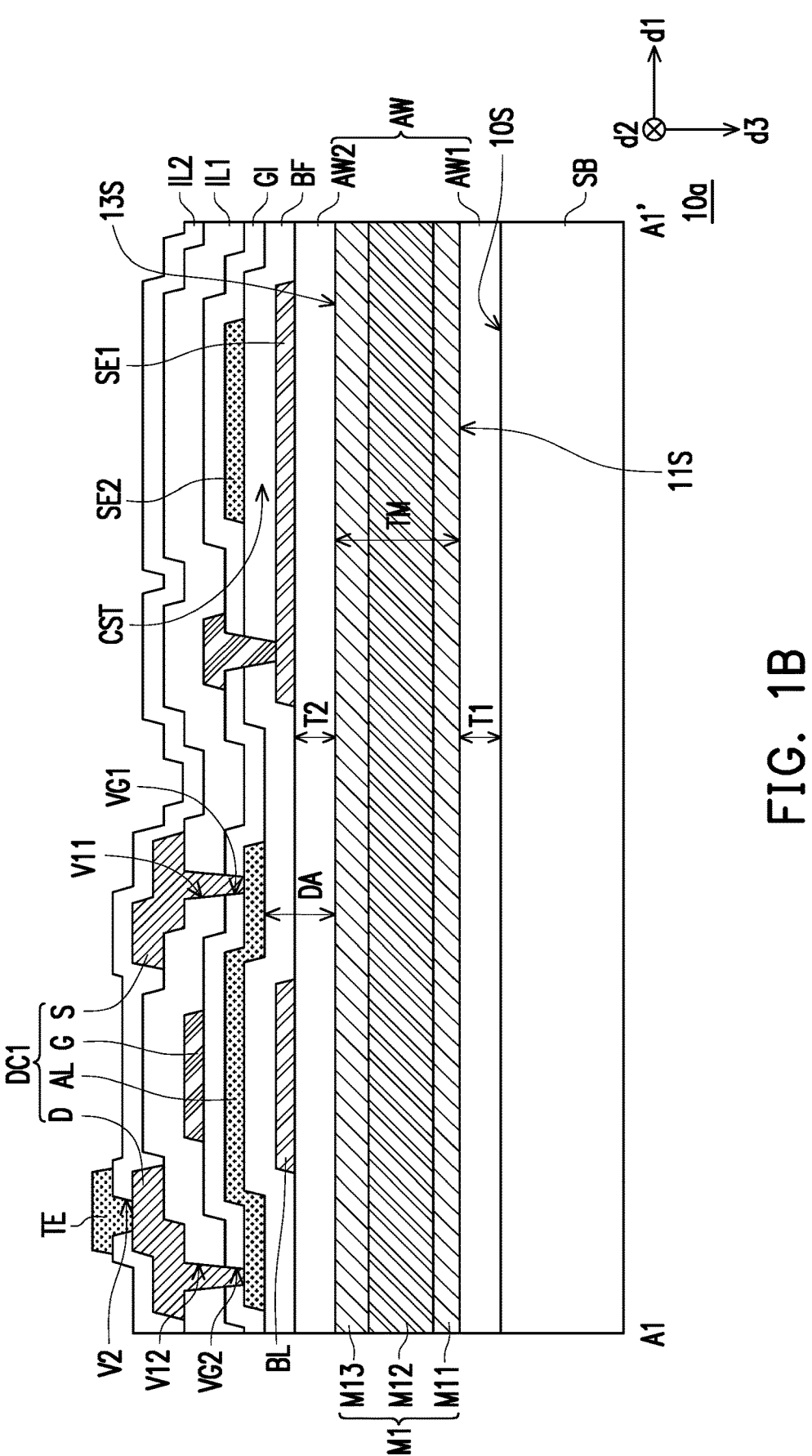
FIG. 1B is a schematic cross-sectional view of an embodiment taken along a section line A1-A1' of FIG. 1A.
Figure 1C:
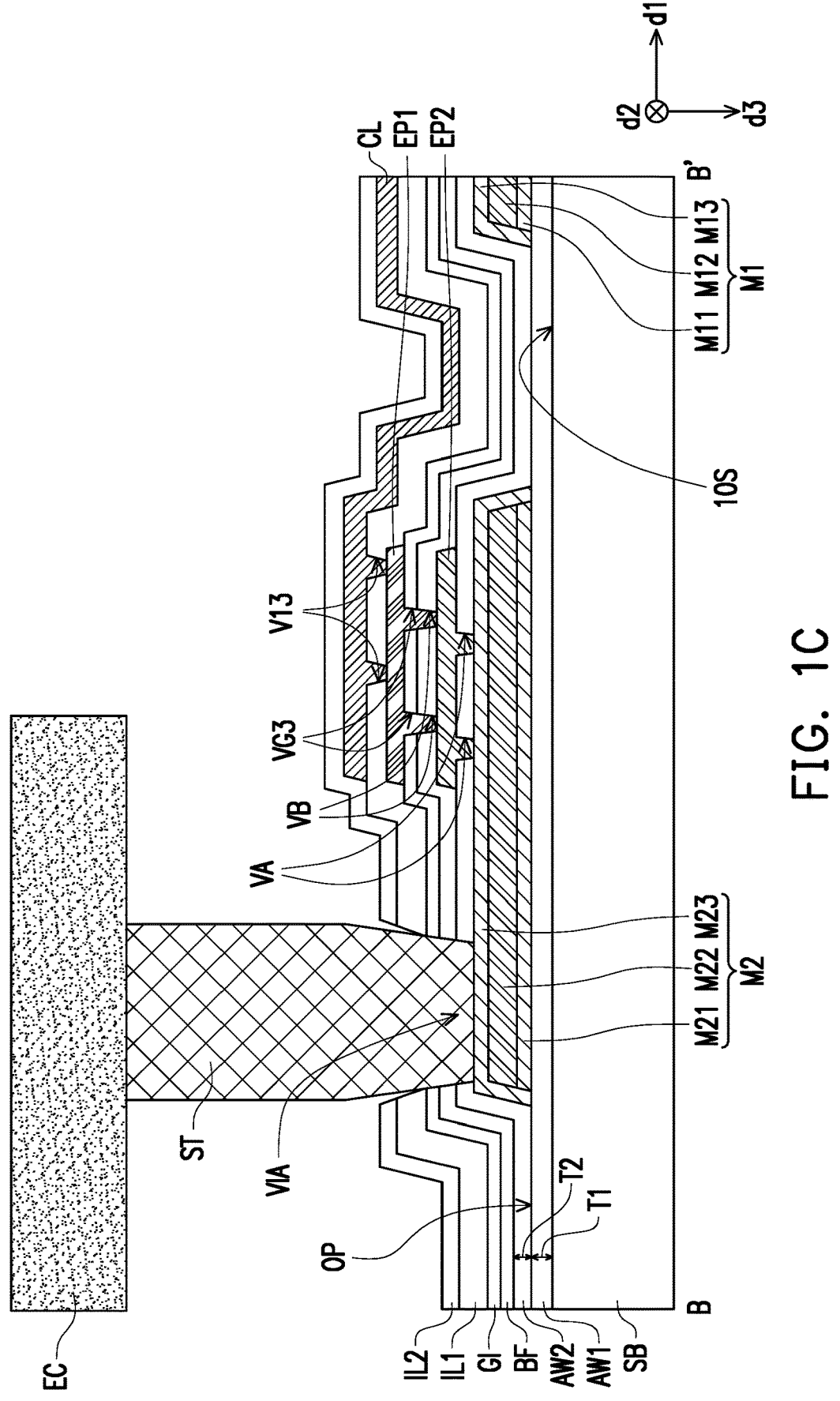
FIG. 1C is a cross-sectional view of an embodiment taken along a section line B-B' of FIG. 1A.

FIG. 1A is a schematic partial top view of an electronic device according to a first embodiment of the disclosure, FIG. 1B is a schematic cross-sectional view of an embodiment taken along a section line A1-A1' of FIG. 1A, and FIG. 1C is a cross-sectional view of an embodiment taken along a section line B-B' of FIG. 1A.

Referring to FIG. 1A, FIG. 1B and FIG. 1C at the same time, an electronic device 10$a$ of the embodiment includes a substrate SB, a conductive layer M, a driving component DC1 and an electronic component EC. The conductive layer M is disposed on the substrate SB. A thickness TM of the conductive layer M may be between 0.5 μm and 12 μm. The first driving component DC1 is disposed on the conductive layer M. The electronic component EC is disposed on the substrate SB and is electrically connected to the first driving component DC1. According to some embodiments, the electronic device 10$a$ may be, for example, a bendable or flexible electronic device, but the disclosure is not limited thereto. The electronic device 10$a$ of the embodiment may include, for example, an antenna device, a display device, a sensing device, a light emitting device or a splicing device, but the disclosure is not limited thereto. In some embodiments, the electronic device 10$a$ is an antenna device. For example, the electronic device 10$a$ may be applicable to a field of communication, a field of radar/lidar, a technology of reconfigurable intelligent surface (RIS) or other suitable fields/technologies, but the disclosure is not limited thereto.

The substrate SB may be a rigid substrate, a flexible substrate, or a combination thereof. A material of the substrate SB may be glass, plastic, quartz, sapphire (sapphire), silicon (Si), germanium (Ge), silicon carbide (SiC), gallium nitride (GaN), silicon germanium (SiGe), polymethyl methacrylate (PMMA), polycarbonate (PC), polyimide (PI), polyethylene terephthalate (PET), other suitable materials, or a combination of the above materials, but the disclosure is not limited in thereto.

The conductive layer M is, for example, disposed on the substrate SB. In some embodiments, the conductive layer M may include a grounding plate. For example, a first conductive portion M1 in the conductive layer M may include the grounding plate. In detail, the first conductive portion M1 may serve as a grounding plate, an electrostatic protection layer, an electromagnetic interference shielding layer, a heat dissipation layer, other layers with other purposes, or a combination thereof of the electronic device 10$a$. For example, as shown in FIG. 1A, a hatched area represents the conductive layer M. The conductive layer M in the electronic device 10$a$ of the embodiment includes the first conductive portion M1 and a second conductive portion M2. For example, the conductive layer M may be patterned into one first conductive portion M1 and a plurality of second conductive portions M2. For the convenience of description, only four second conductive portions M2 are shown in FIG. 1A, but the disclosure is not limited thereto. The first conductive portion M1 may be a grounding plate. The second conductive portions M2 may be pad portions, and the electronic component EC may be electrically connected to the driving component DC1 through the second conductive portion M2, but the disclosure is not limited thereto. According to some embodiments, the grounding plate (the first conductive portion M1) may be electrically connected to a ground voltage.

In some embodiments, as shown in FIG. 1B, the substrate SB has a surface 10S, and the conductive layer M, the first driving component DC1, and the electronic component EC may be disposed on the surface 10S of the substrate SB. On the surface 10S, an area ratio of a surface area of the conductive layer M to a surface area of the surface 10S of the substrate SB may be within a range of 60% to 98%, for example, within a range of 70% to 95%, for example, within a range of 75% to 95%, for example, within a range of 85% to 95%, but the disclosure is not limited thereto. The large-area conductive layer M may be used to shield unwanted electromagnetic waves. In the embodiment, the surface area of the conductive layer M is a sum of a surface area of the first conductive portion M1 and surface areas of the plurality of second conductive portions M2.

As shown in FIG. 1A, the conductive layer M has a plurality of openings OP. For the convenience of description, only 4 openings OP are shown in FIG. 1A, but the disclosure is not limited thereto. According to some embodiments, the openings OP may surround the second conductive portions M2 serving as the pad portions, so as to separate the second conductive portions M2 from the first conductive portion M1, but the disclosure is not limited thereto. In some embodiments, a material of the conductive layer M may include low-resistance materials such as copper, titanium, silver, gold, aluminum, tin, nickel or combinations thereof. However, the material of the conductive layer M may also be, for example, other suitable materials or a combination of the above materials, which is not limited by the disclosure. In addition, the conductive layer M may, for example, include a single-layer structure or a multi-layer structure. For example, in some embodiments, the conductive layer M may include a single copper layer; in some other embodiments, the conductive layer M may include layered structures stacked with each other.

For example, as shown in FIG. 1B, the conductive layer M may be a multilayer structure. For example, the first conductive portion M1 in the conductive layer M includes: a metal nitride layer M11, a metal layer M12, and a metal nitride layer M13 stacked in sequence. The metal nitride layer M11 and the metal nitride layer M13 may be the same or different. The metal nitride layer M11 and the metal nitride layer M13 may include, for example, titanium nitride layers. A material of the metal layer M12 may include copper, titanium, silver, gold, aluminum, tin, nickel, or a combination thereof. According to some embodiments, the first conductive portion M1 includes: a titanium nitride layer M11, a copper layer M12 and a titanium nitride layer M13, but the disclosure is not limited thereto. In addition, as shown in FIG. 1C, similarly, the second conductive portion M2 may include a metal nitride layer M21, a metal layer M22, and a metal nitride layer M23 in sequence. The metal nitride layer M21 and the metal nitride layer M23 may be the same or different. The metal nitride layer M21 and the metal nitride layer M23 may include, for example, titanium nitride layers. A material of the metal layer M22 may include copper, titanium, silver, gold, aluminum, tin, nickel, or a combination thereof. According to some embodiments, in the conductive layer M, the first conductive portion M1 and the plurality of second conductive portions M2 may have a same layered structure, including a same material. According to some embodiments, in the conductive layer M, the first conductive portion M1 and the plurality of second conductive portions M2 may have different layered structures, including different materials.

Moreover, in some embodiments, a thickness TM of the conductive layer M in a third direction d3 of the substrate SB is between 0.5 μm and 12 μm (0.5 μm≤TM≤12 μm). In some embodiments, the thickness TM of the conductive layer M in the third direction d3 of the substrate SB may be between 0.8 μm and 10 μm, such as between 1 μm and 10 μm, or between 1 μm and 5 μm. In some embodiments, when the thickness of the conductive layer M in the third direction d3 of the substrate SB is within the above range, an effect of shielding unwanted electromagnetic waves is achieved.

For the convenience of description, the driving component DC1 shown in FIG. 1A is only schematically shown as a block. According to some embodiments, a specific structure of the driving component DC1 may be as shown in FIG. 1B. The driving component DC1 is, for example, disposed on the conductive layer M. The driving component DC1 may, for example, include an active component, a passive component or a combination thereof, but the disclosure is not limited thereto. In the embodiment, the driving component DC1 may include a thin film transistor, for example, the driving component DC1 may be a thin film transistor. In detail, the driving component DC1 may include, for example, a gate G, a source S, a drain D, and an active layer AL. In some embodiments, a material of the active layer AL may include low temperature polysilicon (LTPS), metal oxide (metal oxide), amorphous silicon (a-Si) or a combination thereof, but the disclosure is not limited thereto. For example, the material of the active layer AL may include but not limited to amorphous silicon, polysilicon, germanium, compound semiconductors (such as gallium nitride, silicon carbide, gallium arsenide, gallium phosphide, indium phosphide, indium arsenide, and/or or indium antimonide), alloy semiconductors (such as SiGe alloys, GaAsP alloys, AlInAs alloys, AlGaAs alloys, GaInAs alloys, GaInP alloys, GaInAsP alloys), or combinations thereof. The material of the active layer AL may also include but not limited to metal oxides, such as indium gallium zinc oxide (IGZO), indium zinc oxide (IZO), indium gallium zinc oxide (IGZTO), or organic semiconductors containing polycyclic aromatic compounds, or a combination thereof. The gate G is, for example, at least partially overlapped with the active layer AL in the third direction d3 of the substrate SB. The source S and the drain D are, for example, separated from each other, and cover at least a part of the active layer AL and are electrically connected to the active layer AL. It should be noted that, the embodiment shows that the driving component DC1 may be any type of a top-gate thin film transistor known to those skilled in the art. However, although the embodiment takes the top-gate thin film transistor as an example for description, the disclosure is not limited thereto.

In the embodiment, as shown in FIG. 1A, the driving component DC1 is electrically connected to the second conductive portion M2 serving as a pad, so as to be electrically connected to the electronic component EC to be introduced later. In addition, in some embodiments, the conductive layer M is at least partially overlapped with the driving component DC1 in the third direction d3 of the substrate SB. In the embodiment, the conductive layer M is overlapped with the driving component DC1 in the third direction d3 of the substrate SB, but the disclosure is not limited thereto.

According to some embodiments, the electronic device may include a plurality of driving components disposed on the conductive layer M. For convenience of description, only four driving components are shown in FIG. 1A, but the disclosure is not limited thereto. The driving components may be electrically connected to the corresponding electronic components EC via the corresponding second conductive portions M2 respectively. For example, in some embodiments, the electronic device 10a further includes a driving component DC2. The driving component DC2 is also, for example, disposed on the conductive layer M, and the driving component DC2 may be adjacent to the driving component DC1 in a first direction d1 or in a second direction d2. The first direction d1 may be perpendicular to the second direction d2, and the first direction d1 and the second direction d2 may be respectively perpendicular to the third direction d3 of the substrate SB, but the disclosure is not limited thereto. For example, the driving component DC2 may be disposed on the conductive layer M together with the driving component DC1 in array arrangement, interleaving arrangement (such as a pentile manner) or other manners, which is not limited by the disclosure. In addition, in some embodiments, the conductive layer M is also at least partially overlapped with the driving component DC2 in the third direction d3 of the substrate SB. In the embodiment, the conductive layer M is overlapped with the driving component DC2 in the third direction d3 of the substrate SB, but the disclosure is not limited thereto. The components and materials of the driving component DC2 may be the same as or similar to those of the aforementioned driving component DC1, and details thereof are not repeated.

In the embodiment, although the driving component DC1 and the driving component DC2 implemented as thin film transistors are taken as an example for description, the disclosure is not limited thereto. For example, according to some embodiments, the driving component DC1 and/or the driving component DC2 may also be a chip (not shown). The chip may include, for example, a timing control circuit, a data driving circuit, a voltage supply circuit, a power driving circuit, other suitable circuits or a combination thereof, and the disclosure is not limited thereto. In some embodiments, the chip may be formed through a panel level package (PLP) process. The panel level package may include a redistribution structure first (RDL first) process or a chip first (chip first) process. Therefore, the substrate SB of the embodiment may have a panel-level size (i.e., an area of the substrate SB may be greater than or equal to 50 cm×50 cm), which may be used to meet the requirement of high production capacity.

The electronic component EC is, for example, disposed on the substrate SB, and may be electrically connected to the first driving component DC1. In some embodiments, the electronic component EC may include a communication component. In detail, the electronic component EC may include, for example, a varactor, a variable capacitor, a radio frequency radiation element, a variable resistor, a phase shifter, an amplifier, an antenna, a biometric sensor, a graphene sensor, other suitable components or combinations thereof. For example, the electronic component EC of the embodiment may include a varactor. The varactor may provide different capacitance values according to signals provided by the driving component DC1 and/or the driving component DC2, i.e., a capacitance of the varactor may be changed by changing a voltage across the varactor. Therefore, by adjusting the capacitance of the varactor, the electronic device 10a of the embodiment may implement adjustment of an operating frequency band, but the disclosure is not limited thereto. In some embodiments, the electronic component EC may be a tunable element, and a specific parameter (such as a physical parameter) of the tunable element may be adjusted according to the applied signals. The specific parameter may include, for example, capacitance, inductance, resistance, dielectric constant, or combinations thereof.

The electronic component EC is, for example, electrically connected to the driving component DC1. In some embodiments, an electrical connection method of the electronic component EC and the driving component DC1 may be as described in the following technical contents. In detail, as shown in FIG. 1B and FIG. 1C, the electronic device 10a of the embodiment further includes a circuit line CL, an electrical connection portion EP1, an electrical connection portion EP2, and an electrical connection portion ST. The electrical connection portion ST may be a surface treatment layer. In some embodiments, the driving component DC1 is electrically connected to the circuit line CL, the circuit line CL is electrically connected to the electrical connection portion EP1, the electrical connection portion EP1 is electrically connected to the electrical connection portion EP2, the electrical connection portion EP2 may be connected to the second conductive portion M2 (pad portion), the second conductive portion M2 is electrically connected to the electrical connection portion ST, and the electrical connection portion ST is electrically connected to the electronic component EC. The electrical connection portion ST may be formed on the second conductive portion M2 through a surface treatment process, and a material of the electrical connection portion ST may include electroless nickel immersion gold, but the disclosure is not limited thereto. Based on this, the electronic component EC and the driving component DC1 may be electrically connected to each other through the arrangement of the circuit line CL, the electrical connection portion EP1, the electrical connection portion EP2 and the electrical connection portion ST. It should be noted that the electronic component EC is also electrically connected to the driving component DC2, and the way that the electronic component EC is electrically connected to the driving component DC2 may be the same as or similar to the technical content stated above, and detail thereof is not repeated.

As shown in FIG. 1B, according to some embodiments, the electronic device 10a may further include a light shielding layer BL, a buffer layer BF, a gate insulating layer GI, an insulating layer IL1, an insulating layer IL2 and a transparent electrode layer TE.

The light shielding layer BL is, for example, disposed on the substrate SB. In the embodiment, the light shielding layer BL may be disposed between the conductive layer M and a channel region of the active layer AL (a region where the active layer AL overlaps with the gate G in the third direction d3 of the substrate SB), but the disclosure is not limited thereto. In some embodiments, the light shielding layer BL at least partially overlaps the channel region of the active layer AL in the third direction d3 of the substrate SB, thereby reducing deterioration of the channel region of the active layer AL due to irradiation of external ambient light. The light shielding layer BL may include a material with a relatively low transmittance, but the disclosure is not limited thereto. In addition, the light shielding layer BL, for example, belongs to a same layer as the aforementioned electrical connection portion EP2, but the disclosure is not limited thereto.

As shown in FIG. 1B, according to some embodiments, the electronic device may include a first insulating layer AW1 disposed between the substrate SB and the conductive layer M. The electronic device may include a second insulating layer AW2 disposed between the conductive layer M and the first driving component DC1. The second insulating layer AW2 may be disposed between the conductive layer M and the light shielding layer BL. The first conductive portion M1 of the conductive layer M has a first surface 11S and a second surface 13S, the first surface 11S is closer to the substrate SB, and the second surface 13S is farther away from the substrate SB. According to some embodiments, the first conductive portion M1 of the conductive layer M may be disposed between the first insulating layer AW1 and the second insulating layer AW2. Namely, the first insulating layer AW1 is disposed (or covered) below the first conductive portion M1 of the conductive layer M, and the second insulating layer AW2 is disposed (or covered) above the first conductive portion M1 of the conductive layer M. According to some embodiments, the first insulating layer AW1 may directly contact the first surface 11S of the first conductive portion M1. According to some embodiments, the second insulating layer AW2 may directly contact the second surface 13S of the first conductive portion M1.

According to some embodiments, the first insulating layer AW1 and the second insulating layer AW2 may be made of materials with appropriate thermal expansion coefficients; or may be made of a material that generates a stress opposite to a stress generated by the conductive layer M during a heating process; or may be made of a material with good adhesion to the conductive layer M. In this way, the first insulating layer AW1 and the second insulating layer AW2 may have a stress regulating effect, and may also be referred to as stress regulating layers. The first insulating layer AW1 and the second insulating layer AW2 are respectively disposed under and above the conductive layer M, which may have the effect of stress regulation, reduce the possibility of substrate warping, and achieve the effect of anti-warping. In some embodiments, a material of the first insulating layer AW1 and the second insulating layer AW2 may be silicon oxide, silicon nitride, silicon oxynitride, or a combination thereof, but the disclosure is not limited thereto. Since multiple heating processes are performed during the process of forming the electronic device 10a, and the material of the conductive layer M has a thermal expansion coefficient greater than that of the material of the substrate SB, the edge of the substrate SB has a tendency to warp toward a direction facing the conductive layer M. The first conductive portion M1 of the conductive layer M may be disposed between the first insulating layer AW1 and the second insulating layer AW2. Namely, the first insulating layer AW1 is disposed (or covered) below the first conductive portion M1 of the conductive layer M, and the second insulating layer AW2 is disposed (or covered) above the first conductive portion M1 of the conductive layer M. In this way, the influence of the first conductive portion M1 on stress may be controlled, and therefore, the warping phenomenon generated in the substrate SB may be reduced through the arrangement of the first insulating layer AW1 and the second insulating layer AW2.

According to some embodiments, the thickness TM of the conductive layer M is controlled between 0.5 μm and 12 μm, which may control the influence of the stress caused by the conductive layer M and reduce the possibility of warping of the substrate SB. According to some embodiments, appropriate insulating layers, such as the first insulating layer AW1 and the second insulating layer AW2, are respectively disposed on upper and lower sides of the conductive layer M, so as to further achieve stress adjustment and reduce the possibility of substrate warping. In the third direction d3, a thickness T1 of the first insulating layer AW1 and a thickness T2 of the second insulating layer AW2 may be smaller than the thickness TM of the conductive layer M. The thickness T1 of the first insulating layer AW1 and the thickness T2 of the second insulating layer AW2 may be the same or different. According to some embodiments, the thickness of the first insulating layer AW1 and the second insulating layer AW2 may be within a range of 0.1 μm to 5 μm, for example, within a range of 0.2 μm to 3 μm, for example, within a range of 0.3 μm to 3 μm, for example, within a range of 0.3 μm to 2 μm.

In some embodiments, the second insulation layer AW2 has a via VA, and the via VA exposes a part of the second conductive portion M2. The aforementioned electrical connection portion EP2 may be electrically connected to the second conductive portion M2 through, for example, the via VA.

The buffer layer BF is, for example, disposed on the substrate SB. In the embodiment, the buffer layer BF is disposed on the second insulating layer AW2 and covers the light shielding layer BL, but the disclosure is not limited thereto. A material of the buffer layer BF may be, for example, an inorganic material (for example, silicon oxide, silicon nitride, silicon oxynitride, or a stacked layer of at least two of the above materials), but the disclosure is not limited thereto.

In the embodiment, at least the buffer layer BF and the second insulating layer AW2 (insulating layer) are disposed between the active layer AL of the driving component DC1 and/or the driving component DC2 and the conductive layer M. A distance DA between the active layer AL of the driving component DC1 and/or the driving component DC2 and the conductive layer M in the third direction d3 of the substrate SB is between 0.3 μm and 2 μm (0.3 μm≤DA≤2 μm). Through such design, a path for metal ions (such as copper ions) in the conductive layer M to flow to the active layer AL of the driving component DC1 and/or the driving component DC2 may be increased, so as to reduce diffusion of metal ions in the conductive layer M to the active layer AL of the driving component DC1 and/or the driving component DC2 during the subsequent heating process.

The gate insulating layer GI is, for example, disposed on the buffer layer BF. In the embodiment, the gate insulating layer GI is disposed between the gate G and the active layer AL and partially covers the active layer AL, i.e., the gate insulating layer GI has a via VG1 and a via VG2 that expose a part of the active layer AL, but the disclosure is not limited thereto. A material of the gate insulating layer GI may be, for example, an inorganic material (for example: silicon oxide, silicon nitride, silicon oxynitride or a stacked layer of at least two of the above materials), an organic material (for example: polyimide resin, epoxy resin, or acrylic resin) or a combination thereof, but the disclosure is not limited thereto.

In some embodiments, the buffer layer BF has a via VB, and the gate insulation layer GI further has a via VG3. The via VB communicates with the via VG3 to expose a part of the electrical connection portion EP2 together. The aforementioned electrical connection portion EP1, for example, belongs to a same layer as the gate G, and may be electrically connected to the electrical connection portion EP2 through, for example, the communicated via VB and via VG3.

The insulating layer IL1 is, for example, disposed on the gate insulating layer GI. In the embodiment, the insulating layer IL1 covers the gate G and exposes a part of the active layer AL, i.e., the insulating layer IL1 has a via V11 and a via V12. The via V11 and the via V12 are respectively communicated with the via VG1 and the via VG1, so that the insulating layer IL1 and the gate insulating layer GI expose a part of the active layer AL together, but the disclosure is not limited thereto. A material of the insulating layer IL1 may be, for example, an inorganic material (for example: silicon oxide, silicon nitride, silicon oxynitride or a stacked layer of at least two of the above materials), an organic material (for example: polyimide resin, epoxy resin or acrylic resin) or a combination thereof, but the disclosure is not limited thereto. In some embodiments, the source S and the drain D are disposed on the insulating layer IL1, and are electrically connected to the active layer AL through the communicated vias V11 and VG1 and the communicated vias V12 and VG2, respectively.

In some embodiments, the insulating layer IL1 further has a via V13. The via V13 exposes a part of the electrical connection portion EP1. The aforementioned circuit line CL belongs to a same layer as the source S and the drain D, and may be, for example, electrically connected to the electrical connection portion EP1 through the via V13.

The insulating layer IL2 is, for example, disposed on the insulating layer IL1. In the embodiment, the insulating layer IL2 covers the source S and partially covers the drain D, i.e., the insulating layer IL2 has a via V2 exposing a part of the drain D, but the disclosure is not limited thereto. A material of the insulating layer IL2 may be, for example, an inorganic material (for example: silicon oxide, silicon nitride, silicon oxynitride or a stacked layer of at least two of the above materials), an organic material (for example: polyimide resin, epoxy resin or acrylic resin) or a combination thereof, but the disclosure is not limited thereto.

In some embodiments, the electronic device 10a further includes a via VIA penetrating through the second insulating layer AW2, the buffer layer BF, the gate insulating layer GI, the insulating layer IL1, and the insulating layer IL2. The via VIA exposes a part of the second conductive portion M2, and the aforementioned surface treatment layer ST may be, for example, electrically connected to the second conductive portion M2 through the via VIA.

The transparent electrode layer TE is, for example, disposed on the insulating layer IL2. In the embodiment, the transparent electrode layer TE is electrically connected to the drain D through the via V2 of the insulating layer IL2, but the disclosure is not limited thereto. A material of the transparent electrode layer TE may be, for example, a metal oxide conductive material (for example: indium tin oxide, indium zinc oxide, aluminum tin oxide, aluminum zinc oxide, indium germanium zinc oxide). The transparent electrode layer TE may be used, for example, to electrically connect the driving component DC1 and/or the driving component DC2 with other electronic components, but the disclosure is not limited thereto.

In some embodiments, the electronic device 10a further includes a storage capacitor CST. In detail, the electronic device 10a includes a storage electrode SE1 and a storage electrode SE2, the storage electrode SE1 and the light-shielding layer BL belong to a same layer, and the storage electrode SE2 and the active layer AL belong to a same layer. The storage electrode SE1 may be electrically connected to a conductive layer belonging to a same layer as the gate G, but the disclosure is not limited thereto. The aforementioned storage electrode SE1, storage electrode SE2, and the buffer layer BF disposed between the storage electrode SE1 and the storage electrode SE2 may constitute a storage capacitor CST.

Figure 2:
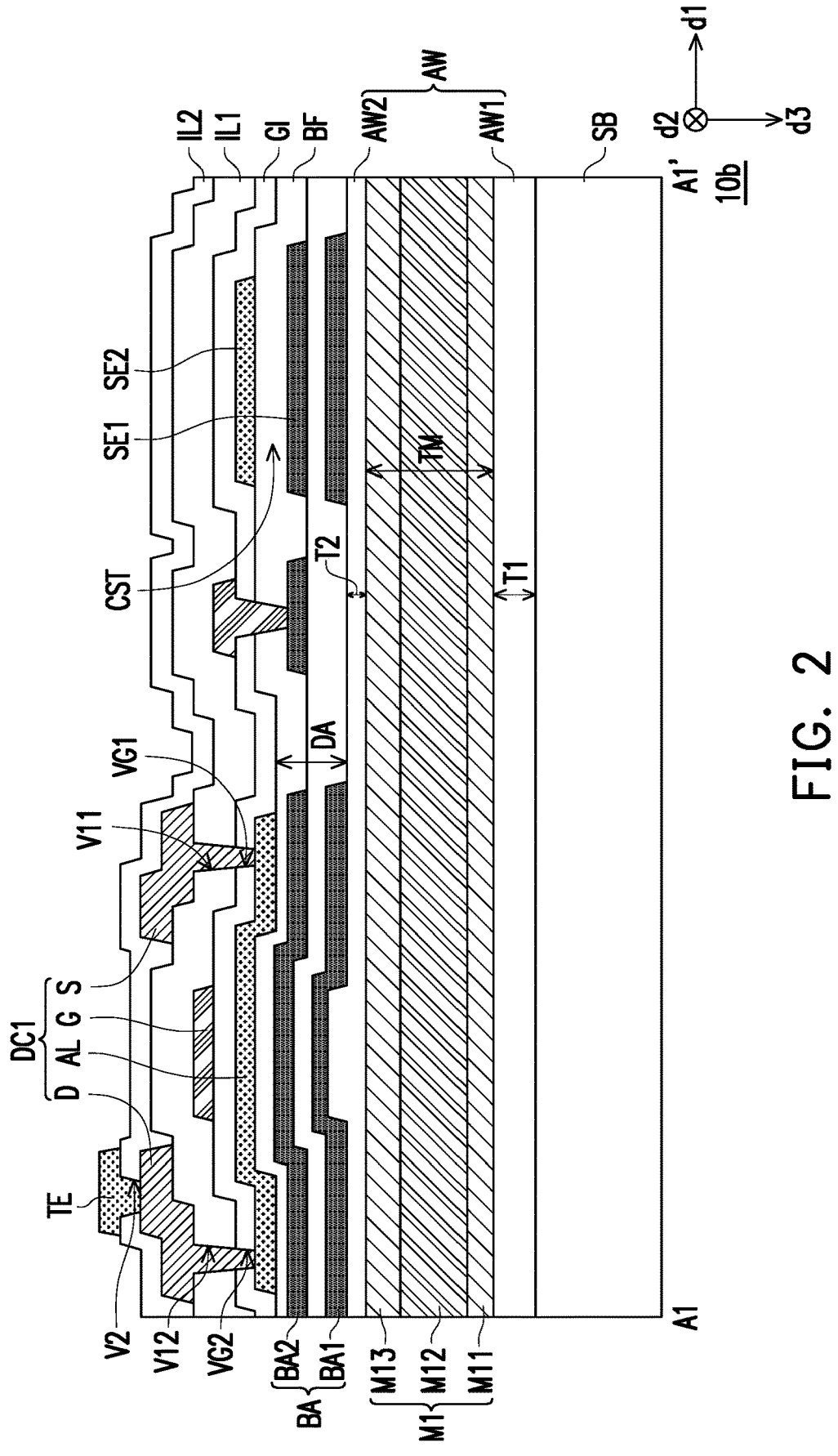
FIG. 2 is a schematic cross-sectional view of another embodiment taken along the section line A1-A1' of FIG. 1A.

FIG. 2 is a schematic cross-sectional view of another embodiment taken along the section line A1-A1' of FIG. 1A. It should be noted that, the embodiment in FIG. 2 may continue to use the component referential numbers and partial content of the embodiment in FIG. 1B. The same or similar referential numbers are used to denote the same or similar components, and the description of the same technical content is omitted.

Referring to FIG. 2, a main difference between an electronic device 10b of the embodiment and the aforementioned electronic device 10a is that the electronic device 10b further includes a barrier layer BA and is not configured with the light shielding layer BL. In the embodiment, the barrier layer BA is disposed between the conductive layer M and the driving component DC1, and is overlapped with the active layer AL in the third direction d3 of the substrate SB. It should be noted that the barrier layer BA may also be disposed between the conductive layer M and the driving component DC2. In some embodiments, the barrier layer BA may be a single-layer structure or a multi-layer structure. For example, as shown in FIG. 2, the barrier layer BA includes a barrier layer BA1 and a barrier layer BA2. The barrier layer BA1 is disposed between the conductive layer M and the second insulating layer AW2, and the barrier layer BA2 is disposed between the second insulating layer AW2 and the buffer layer BF. A material of the barrier layer BA may be, for example, ceramics, glass, plastics, metal oxides, metal nitrides, metals, alloys or combinations thereof. For example, the material of the barrier layer BA may be metal nitride, which may include TiN, MoN, TaN, WN or a combination thereof. In the embodiment, by configuring the barrier layer BA overlapped with the active layer AL in the third direction d3 of the substrate SB in the electronic device 10b, the barrier layer BA may block, capture or obstruct the metal ions (such as copper ions) in the conductive layer M from diffusing to the active layer AL of the driving component DC1 or the active layer AL of the driving component DC2, thereby improving the performance of the electronic device 10b. In addition, since the barrier layer BA also overlaps with the channel region of the active layer AL in the third direction d3 of the substrate SB, it may be used as the aforementioned light-shielding layer, i.e., it may reduce the situation that the channel region of the active layer AL is affected and deteriorated due to irradiation of the external ambient light.

Figure 3:
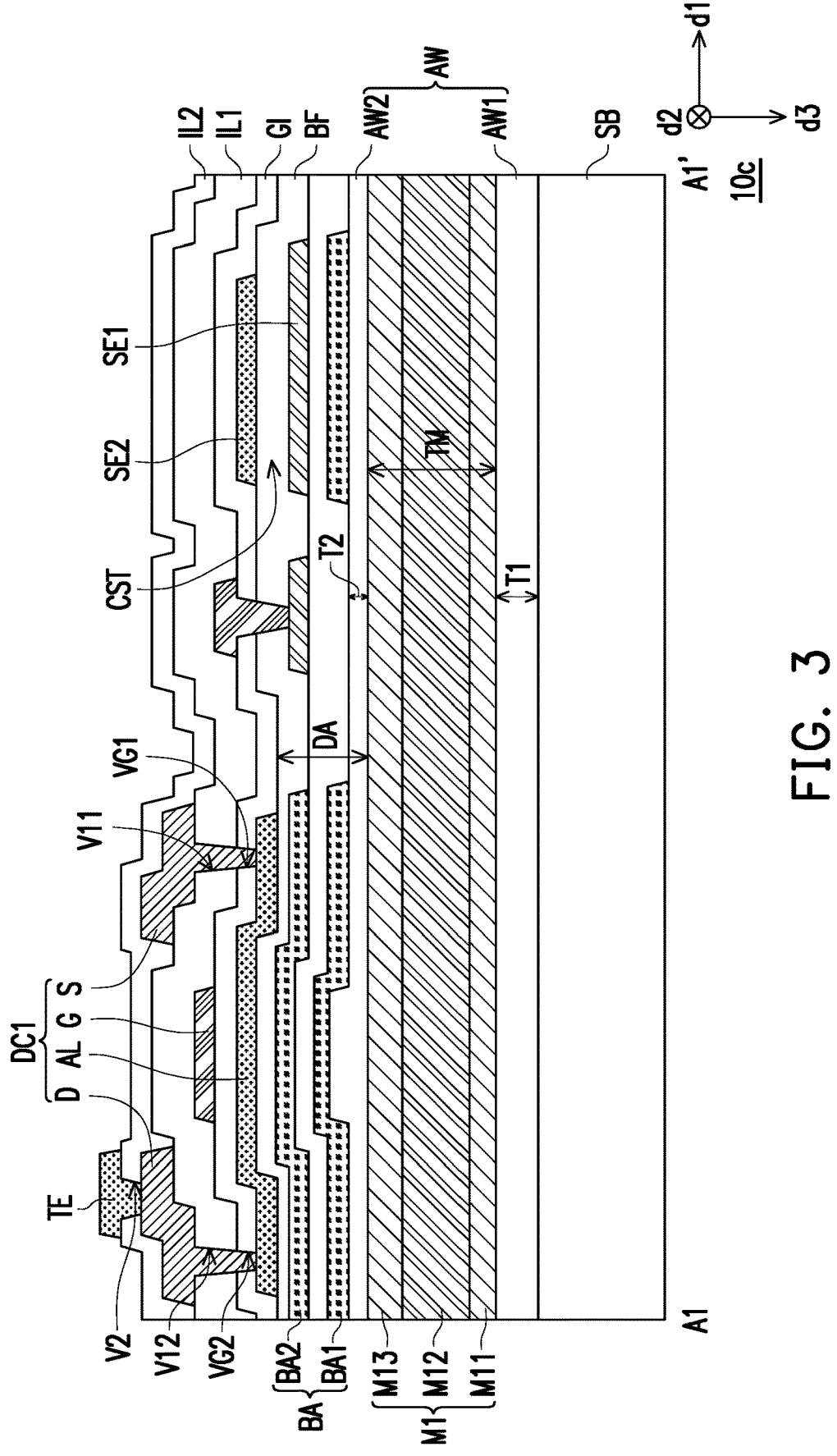
FIG. 3 is a schematic cross-sectional view of still another embodiment taken along the section line A1-A1' of FIG. 1A.

FIG. 3 is a schematic cross-sectional view of still another embodiment taken along the section line A1-A1' of FIG. 1A. It should be noted that the embodiment in FIG. 3 may continue to use the component referential numbers and a part of the content of the embodiment in FIG. 2. The same or similar referential numbers are used to indicate the same or similar components, and the description of the same technical content is omitted.

Referring to FIG. 3, a main difference between an electronic device 10c of the embodiment and the aforementioned electronic device 10b is that the barrier layer BA in the electronic device 10c is an air gap. In the embodiment, the barrier layer BA (air gap) is located between the conductive layer M and the driving component DC1, and overlaps the active layer AL in the third direction d3 of the substrate SB. In some embodiments, the barrier layer BA1 may be formed, for example, during a process of forming the second insulating layer AW2. In detail, before forming the second insulating layer AW2, an organic material layer (not shown) volatilized at a relatively high temperature may be formed on the conductive layer M first, and then a heating process is performed during the process of forming the second insulating layer AW2. The organic material layer volatilizes during the heating process to form a closed space with air or a vacuum space, which is the barrier layer (air gap) BA1. In addition, a formation method of the barrier layer BA2 is the same as or similar to the formation method of the barrier layer BA1, and detail thereof is not repeated here.

Figure 4A:
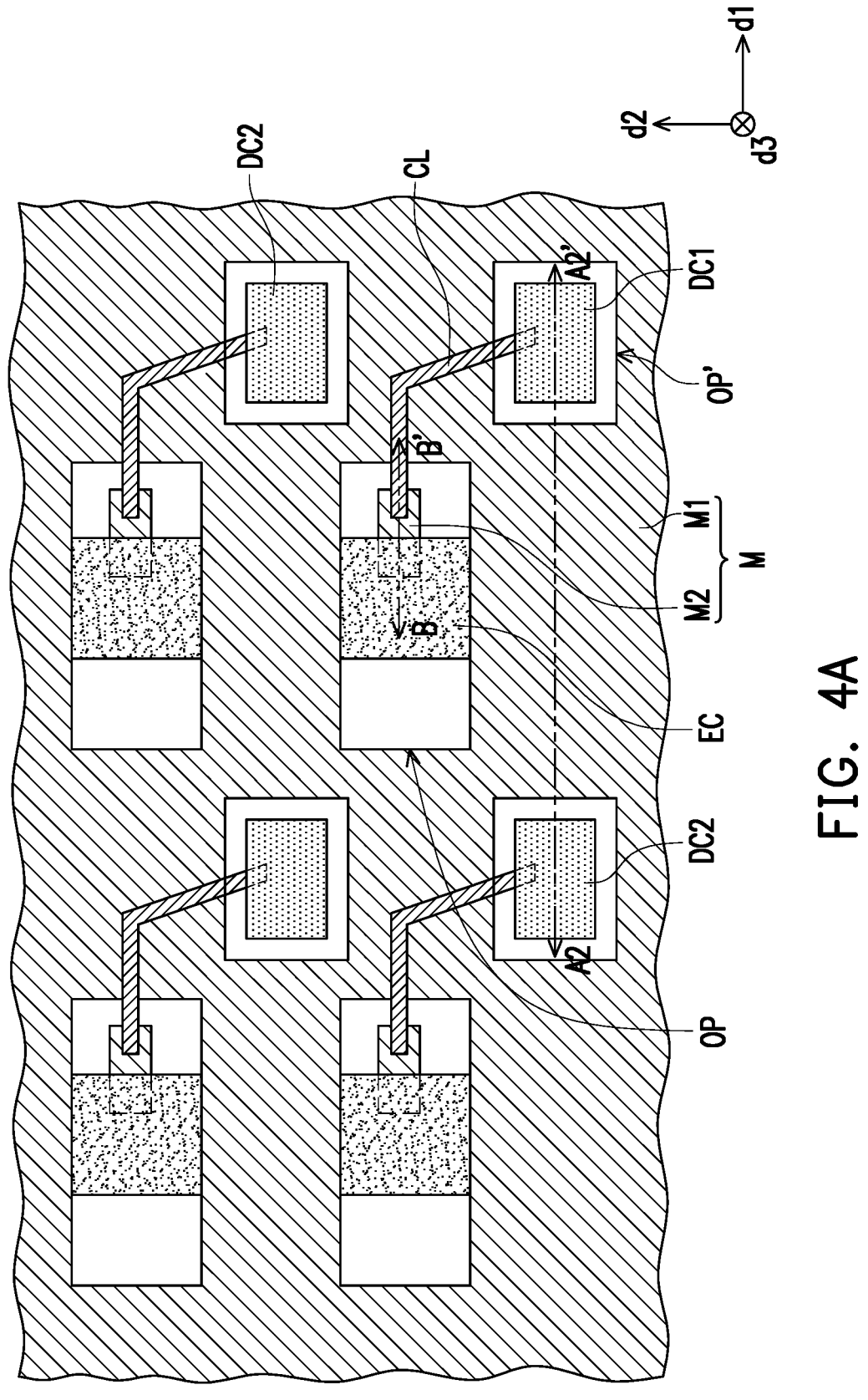
FIG. 4A is a schematic partial top view of an electronic device according to a second embodiment of the disclosure.
Figure 4B:
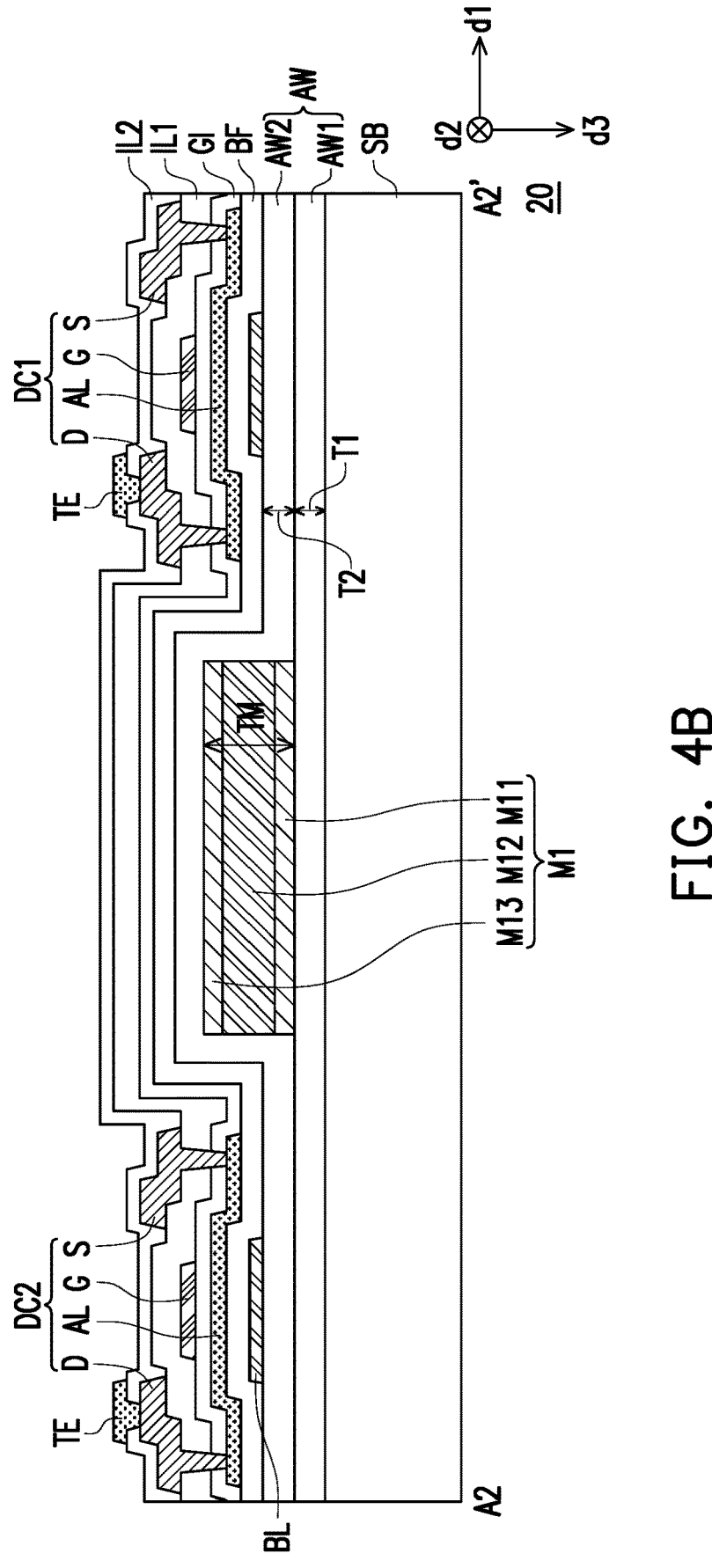
FIG. 4B is a schematic cross-sectional view of an embodiment taken along a section line A2-A2' of FIG. 4A.

FIG. 4A is a schematic partial top view of an electronic device according to a second embodiment of the disclosure, and FIG. 4B is a schematic cross-sectional view of an embodiment taken along a section line A2-A2' of FIG. 4A.

It should be noted that the embodiment in FIG. 4A may continue to use the component referential numbers and a part of the content of the embodiment in FIG. 1A, and the embodiment in FIG. 4B may continue to use the component referential numbers and a part of the content of the embodiment in FIG. 1B. The same or similar referential numbers are used to indicate the same or similar components, and the description of the same technical content is omitted.

Referring to FIG. 4A and FIG. 4B at the same time, a main difference between an electronic device 20 of the embodiment and the aforementioned electronic device 10a is that at least a part of the driving component DC1 in the electronic device 20 is not overlapped with the conductive layer M. In detail, in some embodiments, the first conductive portion M1 included in the conductive layer M has, for example, an opening OP', and at least a part of the driving component DC1 is, for example, not overlapped with the first conductive portion M1 in the third direction d3 of the substrate SB. Alternatively, the opening OP' is at least partially overlapped with the first driving component DC1. In the embodiment, the driving component DC1 in the electronic device 20 is not overlapped with the conductive layer M in the third direction d3 of the substrate SB. In addition, the driving component DC2 in the electronic device 20 is not overlapped with the conductive layer M in the third direction d3 of the substrate SB. Based on such design, since the metal ions (such as copper ions) flowing out from the conductive layer M due to the heating process substantially flow in the direction opposite to the third direction d3 of the substrate SB, which are difficult to diffuse into the active layer AL of the driving component DC1 or into the active layer AL of the driving component DC2, the performance of the electronic device 20 is improved.

According to the above description, some embodiments of the disclosure provide an anti-warping layer and a buffer layer (insulation layer) between the conductive layer and the driving component, which may mitigate a situation that the metal ions in the conductive layer diffuse into the active layer of the driving component in the subsequent heating process, so as to improve the performance of the electronic device. Furthermore, in some embodiments of the disclosure, another anti-warping layer is provided between the conductive layer and the substrate, and through the matching of the two anti-warping layers with the conductive layer, the warpage of the substrate mitigated. Some embodiments of the disclosure also provide a barrier layer between the conductive layer and the driving component, which may also mitigate the diffusion of metal ions of the conductive layer to the active layer of the driving component during the subsequent heating process, thereby improving the performance of electronic device.

In addition, in some other embodiments of the disclosure, at least a part of the driving component and the conductive layer are not overlapped in the top view direction of the substrate, which may also mitigate the diffusion of metal ions of the conductive layer to the active layer of the driving component during the subsequent heating process, so as to improve the performance of electronic device.

In summary, according to some embodiments, in the electronic device, the thickness of the conductive layer under the driving component is controlled within an appropriate range, which may control the influence of the stress caused by the conductive layer and reduce the possibility of substrate warping. According to some embodiments, appropriate insulating layers are disposed on the upper and lower sides of the conductive layer, which may further achieve stress adjustment and reduce the possibility of substrate warping.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An electronic device, comprising:
   a substrate;
   a first insulating layer, disposed on the substrate;
   a conductive layer, disposed on the substrate, wherein a thickness of the conductive layer is between 0.5 μm and 12 μm, and the conductive layer comprises a first conductive portion and a second conductive portion;
   a second insulating layer, disposed on the conductive layer, wherein the conductive layer is disposed between the first insulating layer and the second insulating layer;
   a first driving component, disposed on the first conductive portion of the conductive layer; and
   an electronic component, disposed on the second conductive portion of the conductive layer and electrically connected to the first driving element,
   wherein a thickness of the first insulating layer is smaller than the thickness of the conductive layer, and a thickness of the second insulating layer is smaller than the thickness of the conductive layer,
   wherein the first conductive portion of the conductive layer comprises a grounding plate, the second conductive portion of the conductive layer comprises a pad portion, and the electronic component is electrically connected to the first driving component through the pad portion of the second conductive portion.

2. The electronic device according to claim 1, wherein the first driving component comprises a thin film transistor.

3. The electronic device according to claim 2, wherein the thin film transistor comprises an active layer, and a distance between the active layer and the conductive layer is between 0.3 μm and 2 μm.

4. The electronic device according to claim 1, wherein the thickness of the first insulating layer and the thickness of the second insulating layer are between 0.1 μm and 5 μm.

5. The electronic device according to claim 2, wherein the thin film transistor comprises an active layer, and the active layer comprises polysilicon.

6. The electronic device according to claim 1, further comprising a barrier layer disposed between the conductive layer and the first driving component.

7. The electronic device according to claim 1, further comprising a second driving component disposed on the conductive layer, wherein the conductive layer is overlapped with the first driving component and the second driving component.

8. The electronic device according to claim 1, wherein the electronic component comprises a varactor.

9. The electronic device according to claim 1, wherein a material of the conductive layer comprises copper.

10. The electronic device according to claim 1, wherein the conductive layer comprises a multilayer structure.

11. An electronic device, comprising:

a substrate;

a first insulating layer, disposed on the substrate;

a conductive layer, disposed on the substrate, wherein a thickness of the conductive layer is between 0.5 μm and 12 μm, the conductive layer comprises a first conductive portion and a second conductive portion, and the first conductive portion of the conductive layer has an opening;

a second insulating layer, disposed on the conductive layer, wherein the conductive layer is disposed between the first insulating layer and the second insulating layer;

a first driving component, disposed on the second insulating layer, wherein the first driving component is overlapped with the opening of the first conductive portion of the conductive layer, and in a top view, the first driving component is within the opening; and an electronic component, disposed on the second conductive portion of the conductive layer and electrically connected to the first driving component, wherein a thickness of the first insulating layer is smaller than the thickness of the conductive layer, and a thickness of the second insulating layer is smaller than the thickness of the conductive layer.

12. The electronic device according to claim 11, wherein the first driving component comprises a thin film transistor.

13. The electronic device according to claim 12, wherein the thin film transistor comprises an active layer, and the active layer comprises polysilicon.

14. The electronic device according to claim 11, wherein the first conductive portion of the conductive layer comprises a grounding plate.

15. The electronic device according to claim 11, wherein the electronic component comprises a varactor.

16. The electronic device according to claim 11, wherein the thickness of the first insulating layer and the thickness of the second insulating layer are between 0.1 μm and 5 μm.

* * * * *